(12) United States Patent
Oh

(10) Patent No.: US 10,937,804 B2
(45) Date of Patent: Mar. 2, 2021

(54) SEMICONDUCTOR MEMORY DEVICE

(71) Applicant: SK hynix Inc., Icheon-si (KR)

(72) Inventor: Sung Lae Oh, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/723,711

(22) Filed: Dec. 20, 2019

(65) Prior Publication Data

US 2021/0036005 A1 Feb. 4, 2021

(30) Foreign Application Priority Data

Jul. 30, 2019 (KR) .......................... 10-2019-0092749

(51) Int. Cl.
| *H01L 27/11582* | (2017.01) |
| *G11C 7/18* | (2006.01) |
| *H01L 27/11519* | (2017.01) |
| *H01L 27/1157* | (2017.01) |
| *H01L 27/11556* | (2017.01) |
| *H01L 27/11565* | (2017.01) |
| *H01L 27/11524* | (2017.01) |

(52) U.S. Cl.
CPC .......... *H01L 27/11582* (2013.01); *G11C 7/18* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC ......... H01L 27/11582; H01L 27/11565; H01L 27/1157; H01L 27/11524; H01L 27/11556; H01L 27/11519; G11C 7/18
See application file for complete search history.

(56) References Cited

U.S. PATENT DOCUMENTS

| 10,290,643 | B1 * | 5/2019 | Kai | ................... | H01L 27/11556 |
| 10,707,233 | B1 * | 7/2020 | Cui | ................... | H01L 29/0847 |
| 2017/0186767 | A1 * | 6/2017 | Baek | ................. | H01L 27/11575 |
| 2017/0236896 | A1 * | 8/2017 | Lu | ...................... | H01L 27/11582 257/314 |
| 2020/0027835 | A1 * | 1/2020 | Hsu | ................... | H01L 27/11524 |
| 2020/0161309 | A1 * | 5/2020 | Asami | ................. | H01L 27/108 |
| 2020/0295040 | A1 * | 9/2020 | Tobioka | ............ | H01L 27/11575 |
| 2020/0303398 | A1 * | 9/2020 | Otsu | ................. | H01L 27/11582 |
| 2020/0335516 | A1 * | 10/2020 | Rajashekhar | ..... | H01L 27/11519 |

FOREIGN PATENT DOCUMENTS

| KR | 10-2012-0026255 A | 3/2012 |
| KR | 10-2018-0110797 A | 10/2018 |

* cited by examiner

*Primary Examiner* — Victor A Mandala

(57) ABSTRACT

A semiconductor memory device includes an electrode structure including a plurality of electrode layers and a plurality of interlayer dielectric layers which are alternately stacked on a source plate defined with a cell area and a connection area in a first direction; a vertical channel passing through the electrode structure in the cell area; a hard mask pattern disposed on the electrode structure in the connection area, and having a plurality of opening holes; a plurality of contact holes defined in the electrode structure under the opening holes, and exposing pad areas of the electrode layers; and a slit dividing the hard mask pattern into units smaller than the electrode structure in the connection area.

7 Claims, 21 Drawing Sheets

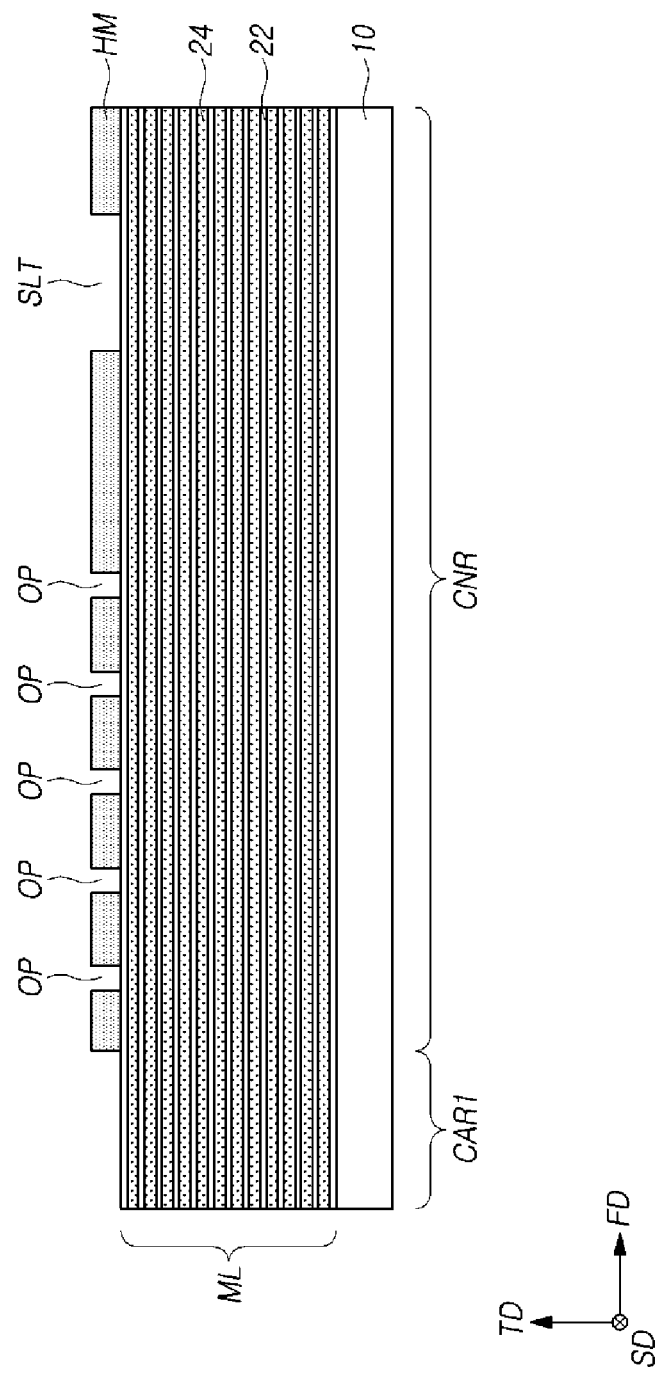

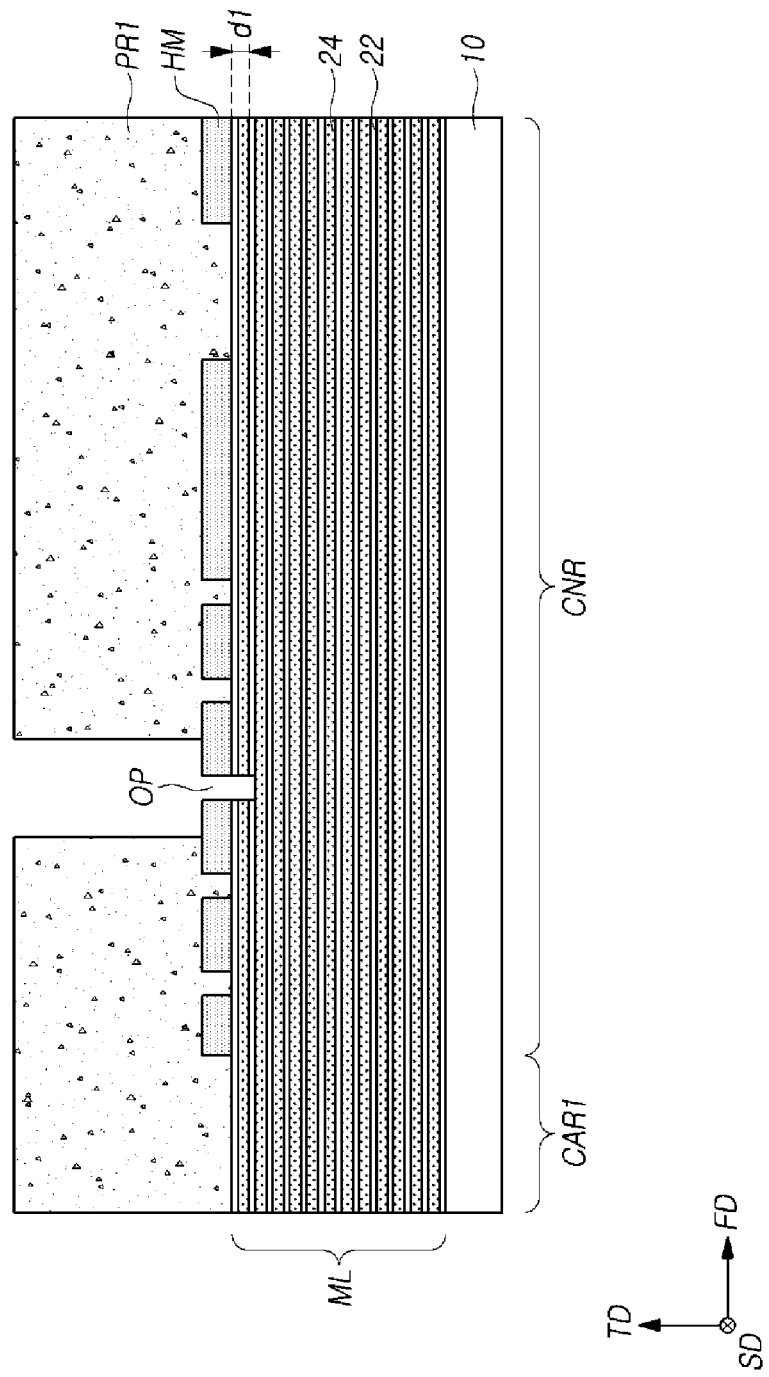

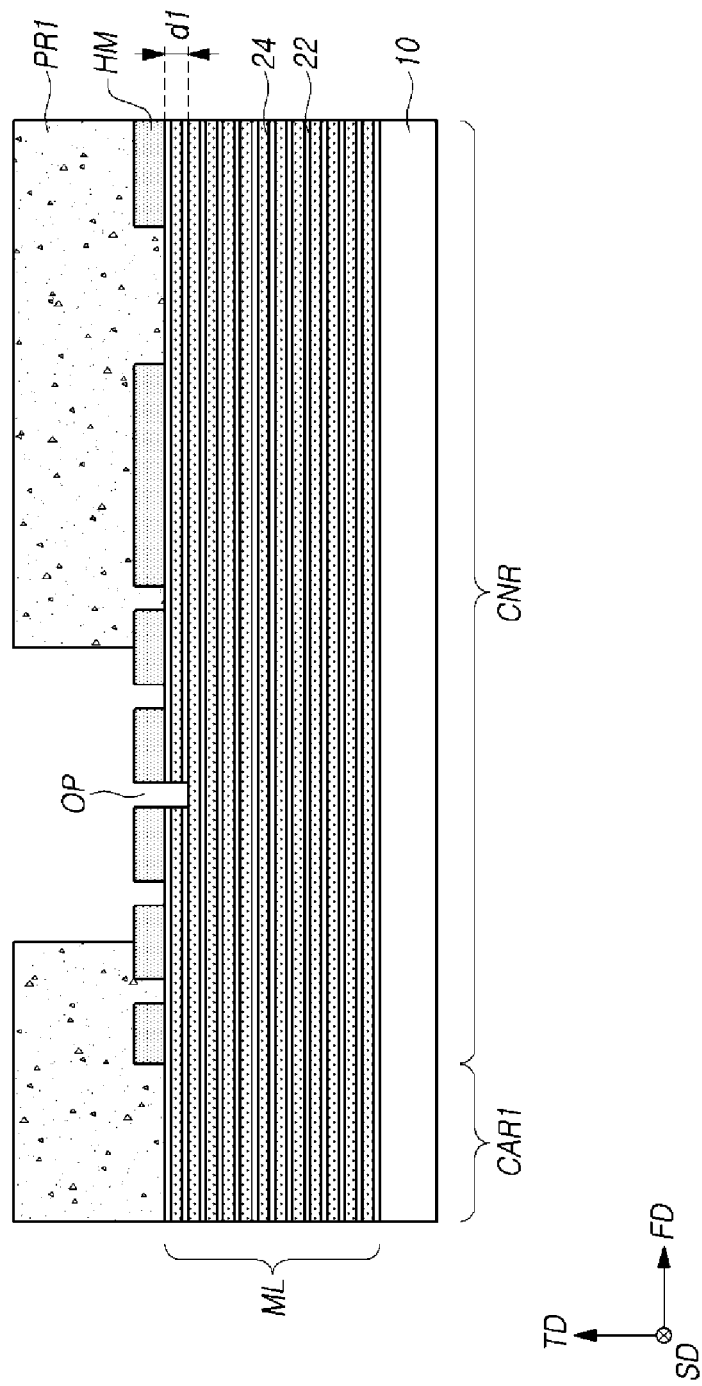

SEMICONDUCTOR MEMORY DEVICE

CROSS-REFERENCE TO RELATED APPLICATION

The present application claims priority under 35 U.S.C. § 119(a) to Korean Patent Application No. 10-2019-0092749 filed in the Korean Intellectual Property Office on Jul. 30, 2019, which is incorporated herein by reference in its entirety.

BACKGROUND

1. Technical Field

Various embodiments generally relate to a semiconductor memory device and, more particularly, to a semiconductor memory device of with three-dimensional structure.

2. Related Art

In order to meet the excellent performance and low prices that consumers demand, increases in the degree of integration of semiconductor memory devices are necessary. Because the degree of integration of a two-dimensional (2D) or planar semiconductor memory device is mainly determined by the area occupied by a unit memory cell, the degree of integration is greatly influenced by the level and complexity of a fine pattern forming technique. However, because substantially expensive equipment is needed for the formation of a fine pattern, the degree of integration of a two-dimensional semiconductor memory device is still limited, although it is increasing. As an alternative to overcome such a limitation, a semiconductor memory device having a three-dimensional structure including three-dimensionally arranged memory cells has been proposed.

SUMMARY

In an embodiment, a semiconductor memory device may include: an electrode structure including a plurality of electrode layers and a plurality of interlayer dielectric layers which are alternately stacked on a source plate defined with a cell area and a connection area in a first direction; a vertical channel passing through the electrode structure in the cell area; a hard mask pattern disposed on the electrode structure in the connection area, and having a plurality of opening holes; a plurality of contact holes defined in the electrode structure under the opening holes, and exposing pad areas of the electrode layers; and a slit dividing the hard mask pattern into units smaller than the electrode structure in the connection area.

In an embodiment, a semiconductor memory device may include: a logic structure disposed on a substrate which is defined with a cell area and a connection area in a first direction; an electrode structure including a plurality of electrode layers and a plurality of interlayer dielectric layers which are alternately stacked on a source plate disposed on the logic structure; a vertical channel passing through the electrode structure in the cell area; a hard mask pattern disposed on the electrode structure in the connection area, and having a plurality of opening holes; a plurality of contact holes defined in the electrode structure under the opening holes, and exposing pad areas of the electrode layers; and a discharge path coupling the hard mask pattern and the substrate.

BRIEF DESCRIPTION OF THE DRAWINGS

FIGS. 10A to 14A are examples of top views to assist in the explanation of steps of a method for manufacturing a semiconductor memory device in accordance with an embodiment of the disclosure.

FIGS. 10B to 14B are cross-sectional views taken along the lines A-A' of FIGS. 10A to 14A in accordance with an embodiment of the disclosure.

DETAILED DESCRIPTION

Figure 1:
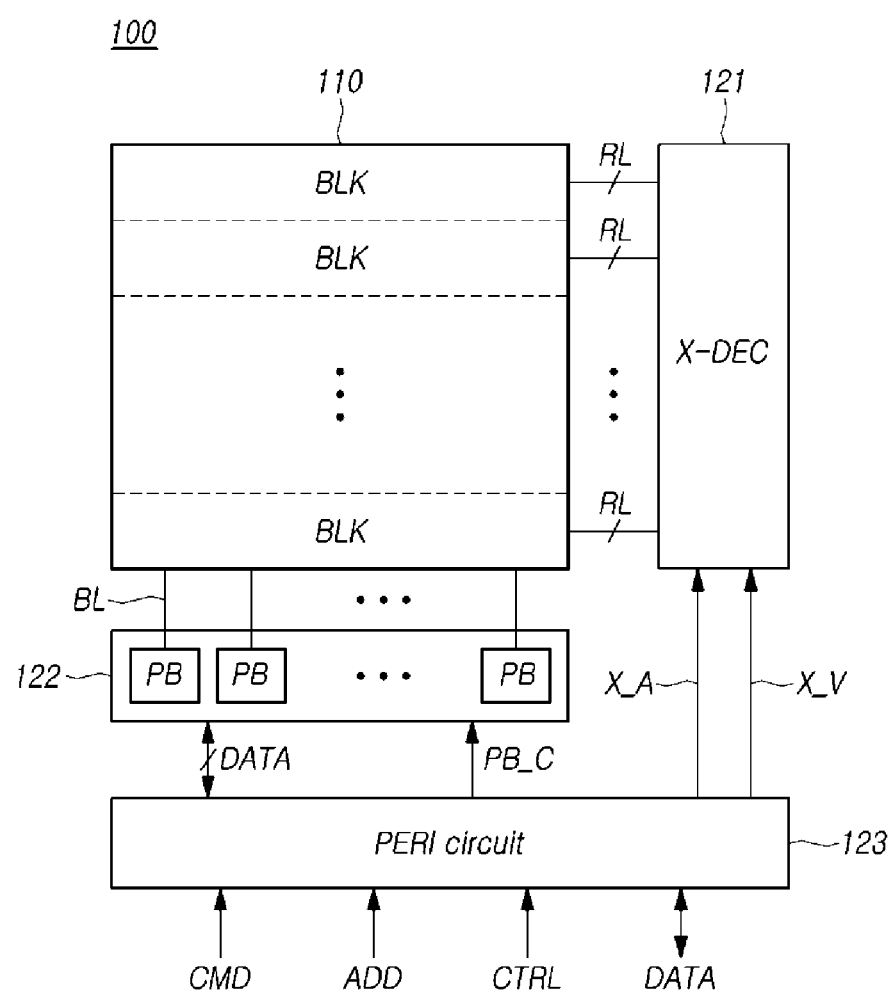
FIG. 1 is a block diagram illustrating an example of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or the clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other, and do not to imply or suggest the substances, order, sequence or number of the components. If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Also, elements in embodiments of the disclosure are not limited by these terms. These terms are used to merely distinguish one element from another. Accordingly, as used herein, a first element may be a second element within the technical idea of the disclosure.

Features of various exemplary embodiments of the disclosure may be coupled, combined or separated partially or totally. Technically various interactions and operations are possible. Various exemplary embodiments can be practiced individually or in combination.

Hereinafter, a semiconductor memory device will be described below in detail with reference to the accompanying drawings through various examples of embodiments of the disclosure.

FIG. 1 is a block diagram illustrating an example of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, all coupled together in series. Each memory cell may be a volatile memory cell or may be a nonvolatile memory cell. While the descriptions below use a vertical NAND flash device as an example of the semiconductor memory device 100, it is to be understood that the technical spirit of the present disclosure is not limited thereto.

The memory cell array 110 may be coupled to the row decoder 121 through row lines RL. The row lines RL may include at least one drain select line, a plurality of word lines and at least one source select line. The memory cell array 110 may be coupled to the page buffer circuit 122 through bit lines BL.

The row decoder 121 may select any one, among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK selected among the memory blocks BLK included in the memory cell array 110.

The page buffer circuit 122 may include a plurality of page buffers PB which are coupled to the bit lines BL, respectively. The page buffer circuit 122 may receive a page buffer control signal PB_C from the peripheral circuit 123, and may transmit and receive a data signal DATA to and from the peripheral circuit 123. The page buffer circuit 122 may control the bit lines BL, which are arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write data in or read data from memory cells which are coupled to an activated word line.

The peripheral circuit 123 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, that are required in the semiconductor memory device 100.

Hereinbelow, in the accompanying drawings, two directions that are parallel to the top surfaces of a substrate or/and a source plate and intersect with each other are defined as a first direction FD and a second direction SD, respectively, and a direction that intersect with the top surfaces of the substrate or/and the source plate is defined as a third direction TD. For example, the first direction FD may correspond to the extending direction of word lines, and the second direction SD may correspond to the extending direction of bit lines. The first direction FD and the second direction SD may substantially perpendicularly intersect with each other. The third direction TD may perpendicularly intersect with the first direction FD and the second direction SD. In the following descriptions, the term 'vertical' or 'vertical direction' will be used as substantially the same meaning as the third direction TD. In the drawings, a direction indicated by an arrow and a direction opposite thereto represents the same direction.

Figure 2:
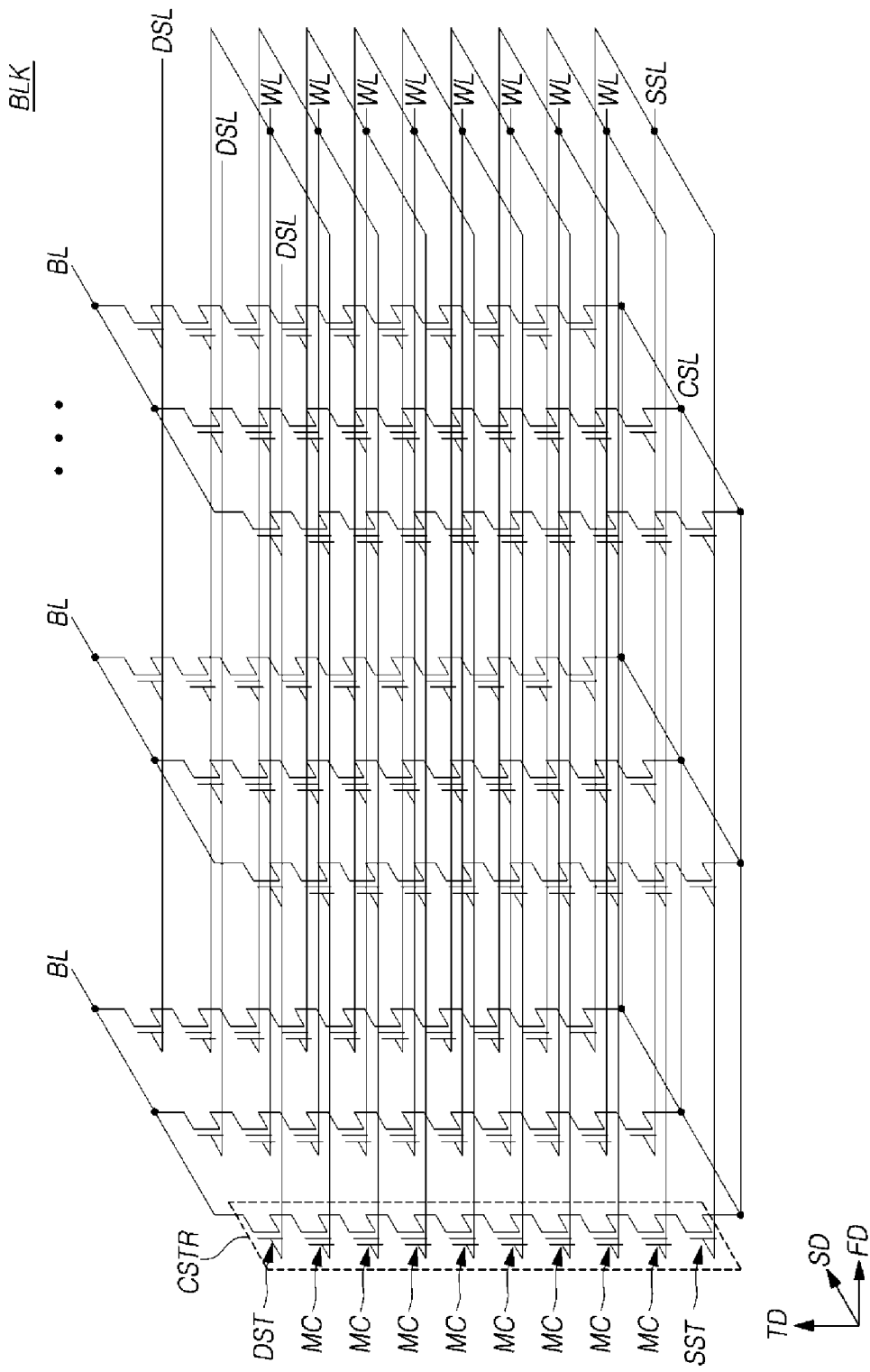
FIG. 2 is an equivalent circuit diagram illustrating an example of a of memory block illustrated in FIG. 1 in accordance with an embodiment of the disclosure.

FIG. 2 is an equivalent circuit diagram illustrating an example of one of the memory blocks BLK illustrated in FIG. 1 in accordance with an embodiment of the disclosure.

Referring to FIG. 2, the memory block BLK may include a plurality of cell strings CSTR which are coupled between a plurality of bit lines BL and a common source line CSL.

The bit lines BL may extend in the second direction SD, and may be arranged in the first direction FD. A plurality of cell strings CSTR may be coupled in parallel to each of the bit lines BL. The cell strings CSTR may be coupled in common to the common source line CSL. The plurality of cell strings CSTR may be disposed between the plurality of bit lines BL and the one common source line CSL.

Each of the cell strings CSTR may include a drain select transistor DST which is coupled to a bit line BL, a source select transistor SST which is coupled to the common source line CSL, and a plurality of memory cells MC which are coupled between the drain select transistor DST and the source select transistor SST. The drain select transistor DST, the memory cells MC and the source select transistor SST may be coupled in series in the third direction TD.

Drain select lines DSL, a plurality of word lines WL and a source select line SSL may be disposed between the bit lines BL and the common source line CSL in the third direction TD. The drain select lines DSL may be coupled to the gates of corresponding drain select transistors DST, respectively. The word lines WL may be coupled to the gates of corresponding memory cells MC, respectively. The source select line SSL may be coupled to the gates of source select transistors SST. Memory cells MC which are coupled in common to one word line WL may constitute one page.

Figure 3:
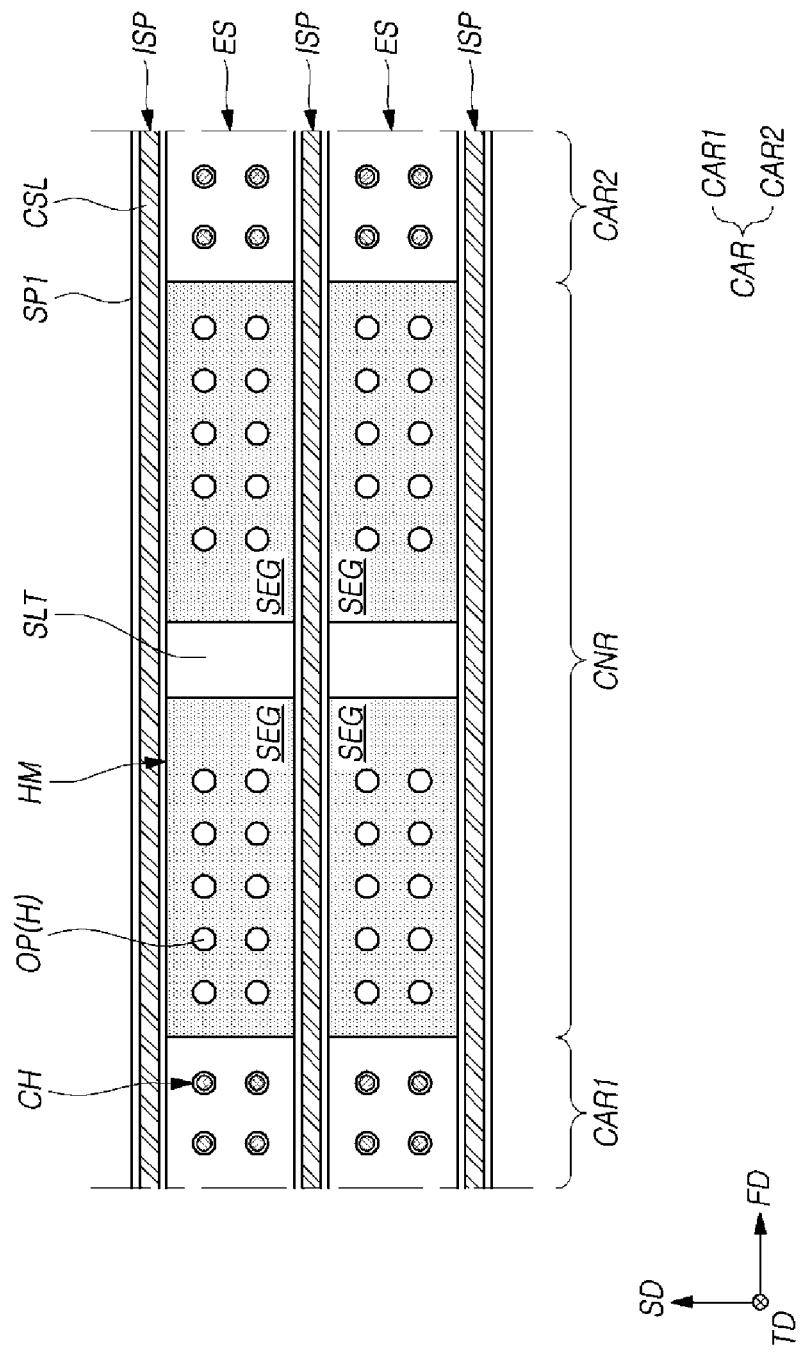
FIGS. 3 and 4 are top views illustrating examples of portions of semiconductor memory devices in accordance with embodiments of the disclosure.
Figure 4:
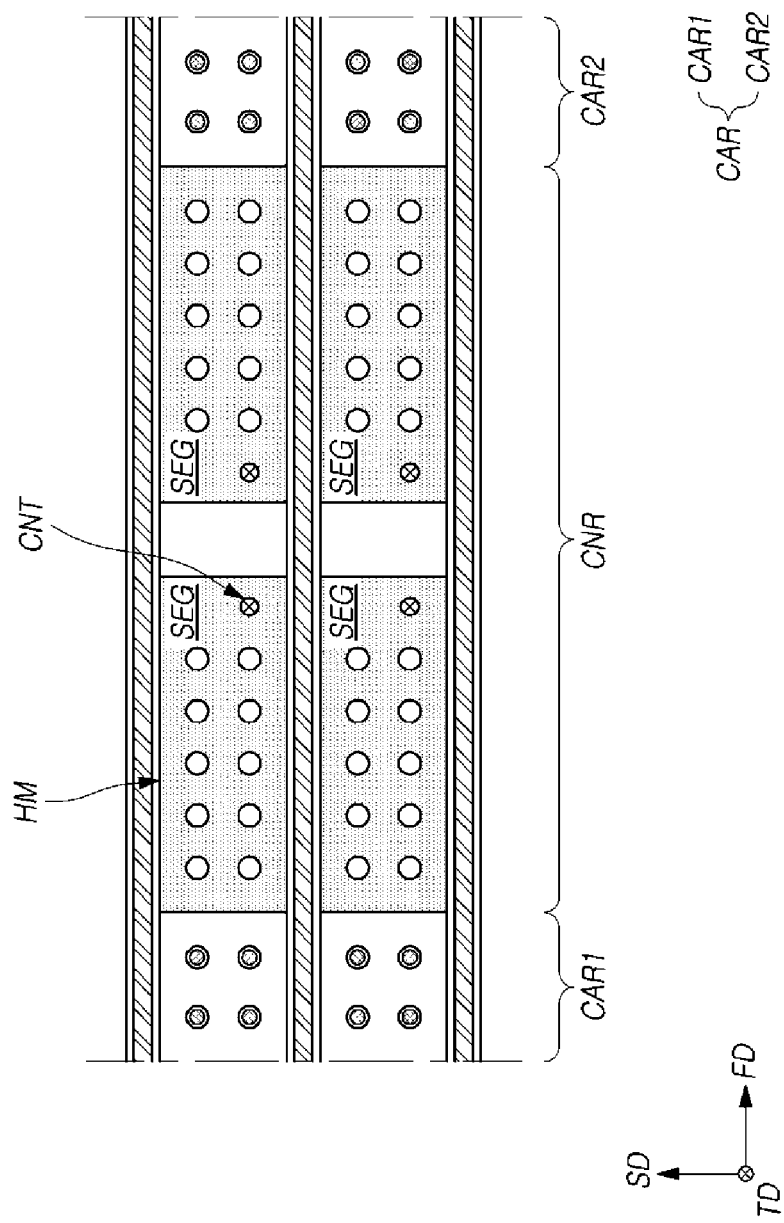

FIGS. 3 and 4 are top views illustrating examples of portions of semiconductor memory devices in accordance with embodiments of the disclosure.

Referring to FIG. 3, a semiconductor memory device may include a cell area CAR and a connection area CNR. The cell area CAR may include a first cell area CAR1 and a second cell area CAR2, which are disposed and spaced apart in the first direction FD. The connection area CNR may be disposed between the first cell area CAR1 and the second cell area CAR2. The first cell area CAR1, the connection area CNR and the second cell area CAR2 may be sequentially disposed in the first direction FD.

Electrode structures ES may be disposed in and spaced apart in the second direction SD, and each electrode structure ES may span across the first cell area CAR1, the connection area CNR and the second cell area CAR2. The electrode structures ES may be separated from each other by separation patterns ISP that extend in the first direction FD, and disposed and spaced apart in the second direction SD. Each separation pattern ISP may include a conductive layer pattern CSL, which extends in the first direction FD. A sidewall dielectric layer SP1 may be disposed as an insulation layer between the conductive layer pattern CSL and the electrode structure ES. Although not illustrated, the bottom end of the conductive layer pattern CSL may be coupled to a source plate (not illustrated). The conductive layer pattern CSL may constitute a common source line.

Each of the electrode structures ES may be disposed between a pair of adjacent separation patterns ISP. The electrode structures ES may extend in the first direction FD, and may be disposed in and spaced apart in the second direction SD.

Vertical channels CH, which pass through or penetrate the electrode structures ES, may be defined or disposed in the first and second cell areas CAR1 and CAR2. One electrode structure ES and vertical channels CH passing through the same may constitute one memory block (BLK of FIG. 1). A memory cell array 110 as illustrated in FIG. 1 may be configured with a plurality of electrode structures ES disposed in intervals in the second direction SD.

A hard mask pattern HM may be disposed on the electrode structures ES in the connection area CNR. The hard mask pattern HM may end at the boundary between the connection area CNR and first and second cell areas CAR1 and CAR2, respectively, such that the electrode structures ES in the first and second cell areas CAR1 and CAR2 do not include a hard mask pattern HM and are exposed. The hard mask pattern HM may be divided or segmented by the separation patterns ISP. The hard mask pattern HM may be used as an etch mask in an etching process for forming contact holes H in the electrode structures ES. The hard mask pattern HM may be formed of a metal.

A plurality of opening holes OP may be defined in the hard mask pattern HM. The contact holes H may be defined in the electrode structures ES under the opening holes OP. The contact holes H may be formed using the hard mask pattern HM as an etch mask. When viewed from the top, the contact holes H may have substantially the same shape or outline as the opening holes OP of the hard mask pattern HM.

A slit SLT may be defined in the hard mask pattern HM in the connection area CNR such that the hard mask pattern HM may be divided into units smaller than the electrode structures ES. For example, the hard mask pattern HM may be divided by the slit SLT into a plurality of segments SEG further bounded by separation pattern ISP and the edges of connection area CNR. The slit SLT may be defined between a pair of adjacent separation patterns ISP, and the segments SEG of the hard mask pattern HM may be spaced apart along the electrode structure ES in the first direction FD. The length of each segment SEG as measured along the first direction FD is smaller than the overall length of the electrode structure ES as measured in the first direction FD in the connection area CNR. The width of each segment SEG in the second direction SD may be substantially the same as the width of the electrode structure ES in the second direction SD.

The contact holes H may be formed through a plasma etching process, for example, a reactive ion etching (RIE) process. As an etching gas, introduced into a process chamber during process step for forming the contact holes H, is plasmarized by a high frequency power source and the positive (+) charges of the plasmarized etching gas collide with an etching target, the etching target may be etched. While the plasma etching process proceeds, the positive charges may be charged in and accumulate in the hard mask pattern HM. The accumulated positive charges charged in the hard mask pattern HM may obstruct the flow of an etching gas in a subsequent plasma etching process, thereby causing an etching failure.

When compared to a case in which a hard mask pattern is formed to have the same, larger area as the electrode structure ES in the connection area CNR, according to an embodiment, because the hard mask pattern HM is divided by the slit SLT into the units smaller than the electrode structures ES in the connection area CNR, the amount or magnitude of positive charges charged in the hard mask pattern HM may be reduced. Therefore, an etching failure that may occur in the subsequent plasma etching process due to the presence of accumulated positive charges charged in the hard mask pattern HM may be suppressed or its effects minimized.

Referring to FIG. 4, a contact plug CNT may be coupled to the hard mask pattern HM in the connection area CNR to form a discharge path. The positive charges charged in the hard mask pattern HM may be discharged through the contact plug CNT.

A contact plug CNT may be provided for each of the segments SEG of the hard mask pattern HM. Although the present embodiment illustrates a case in which one contact plug CNT is provided for each of the segments SEG, it is to be noted that the disclosure is not limited thereto. A plurality of contact plugs CNT may be provided for each of the segments SEG.

Hereinbelow, a semiconductor memory device in accordance with an embodiment of the disclosure will be described in detail with additional reference to FIGS. 5 and 6. For the sake of convenience in explanation, repeated descriptions for the same components as those described above with reference to FIGS. 3 and 4 will be omitted.

Figure 5:
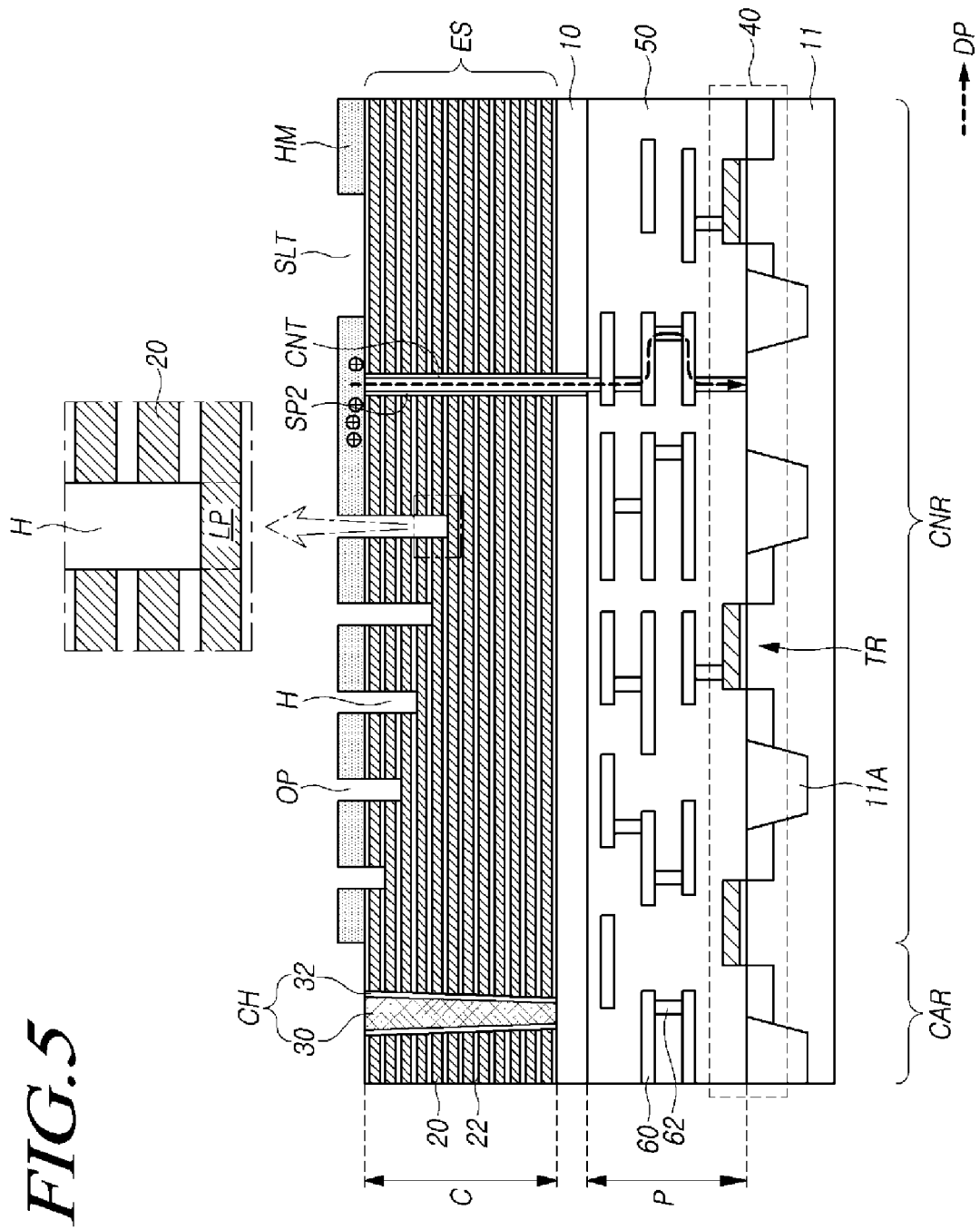
FIGS. 5 to 8 are cross-sectional views illustrating examples of semiconductor memory devices in accordance with embodiments of the disclosure.
Figure 6:
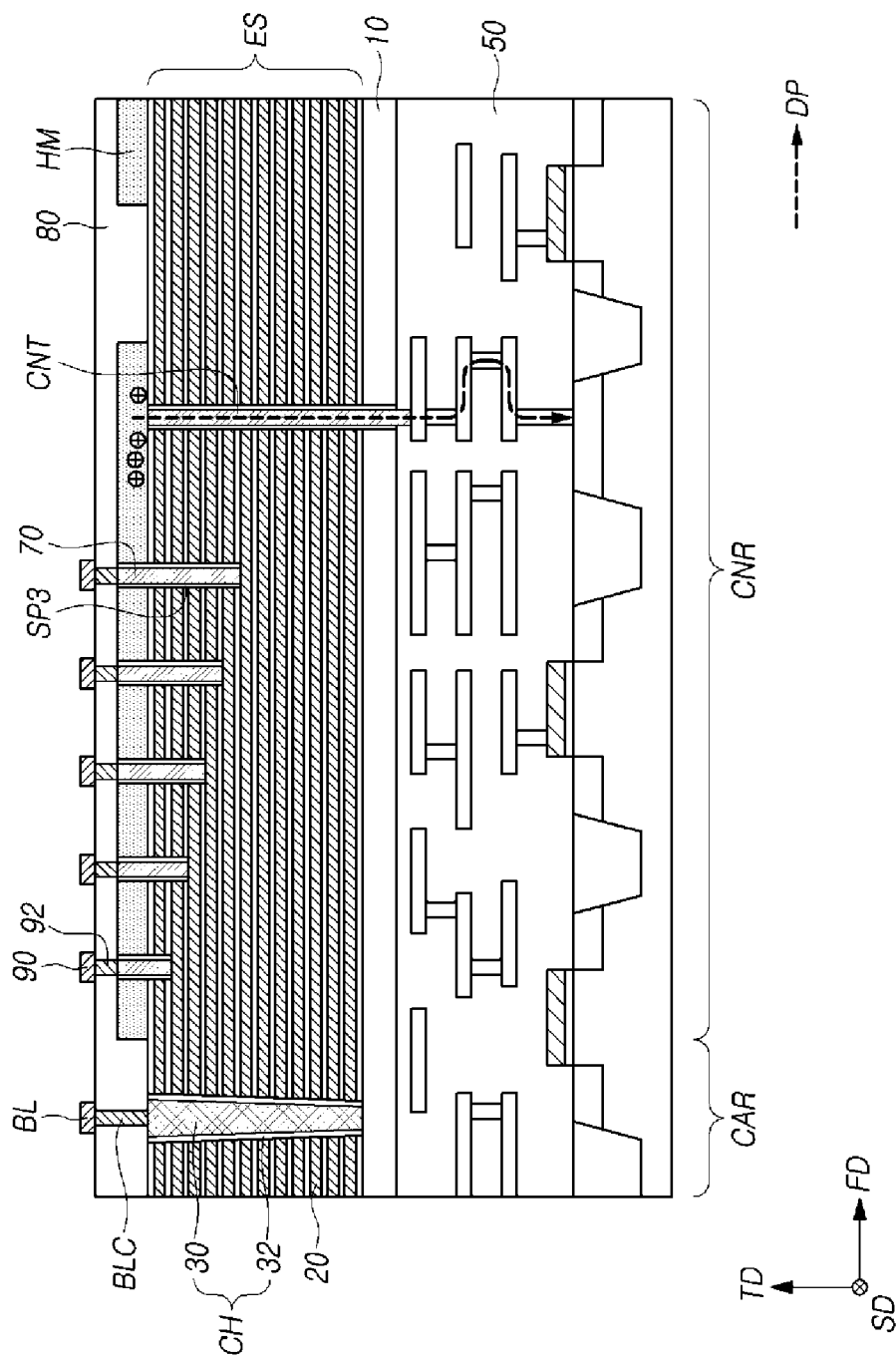

FIGS. 5 and 6 are cross-sectional views illustrating an example of a semiconductor memory device in accordance with an embodiment of the disclosure.

Referring to FIG. 5, the semiconductor memory device may have a PUC (peri under cell) structure. A logic structure P may be disposed under a memory structure C. The memory structure C may be disposed on a source plate 10. The logic structure P may be disposed on a substrate 11.

For example, the substrate 11 may include at least one among silicon (Si), germanium (Ge), silicon germanium (SiGe), gallium arsenide (GaAs), indium gallium arsenide (InGaAs), aluminum gallium arsenide (AlGaAs) and a compound thereof. The substrate 11 may be constituted by a bulk silicon substrate, a silicon-on-insulator (SOI) substrate, a germanium substrate, a germanium-on-insulator (GOI) substrate, a silicon-germanium substrate, or a substrate of an epitaxial thin film obtained by performing selective epitaxial growth (SEG), for example. In another example, the substrate 11 may be formed of a dielectric material, and may include a single film or a plurality of thin films. For example, the substrate 11 may be a silicon oxide layer, a silicon nitride layer, a low-k dielectric layer, or the like.

The source plate 10 may be formed of polysilicon. Unlike the substrate 11, which may use monocrystalline silicon, the source plate 10, which is formed on the logic structure P, may be formed of polysilicon.

The memory structure C may include an electrode structure ES, a vertical channel CH, and a hard mask pattern HM. The electrode structure ES may include a plurality of electrode layers 20, which are disposed in the third direction TD, separated and spaced apart from one another. The electrode layers 20 may include a conductive material. For example, the electrode layers 20 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). Interlayer dielectric layers 22 may be disposed over and under, or in between, the electrode layers 20. The interlayer dielectric layers 22 may include silicon oxide.

The electrode layers 20 may constitute the row lines RL described above with reference to FIG. 1. A source select line SSL may include at least one layer of the electrode layers 20 closest to the substrate 11 in the third direction TD. A drain select line DSL may include at least one layer of the electrode layers 20 furthest away from the substrate 11 in the third direction TD. The electrode layers 20 between the source select line and the drain select line may constitute word lines.

Vertical channels CH may pass through or penetrate the alternating stack of electrode layers 20 and interlayer dielectric layers 22 in a cell area CAR in the third direction. The bottom ends of the vertical channels CH may be coupled to the source plate 10. Each of the vertical channels CH may include a channel layer 30 and a gate dielectric layer 32.

The channel layer 30 may include polysilicon or monocrystalline silicon, and may include a P-type impurity such as boron (B) that is localized in some areas thereof. As an example, the channel layer 30 may have the shape of a solid pillar or cylinder whose center region is completely filled. In another example, the channel layer 30 may have the shape of a tube whose center region is open. A buried dielectric layer may be formed in the open center region of the channel layer 30. The gate dielectric layer 32 may have the shape of a straw or a cylindrical shell which surrounds the outer wall of the channel layer 30. While not illustrated, the gate dielectric layer 32 may include a tunnel dielectric layer, a charge storage layer and a blocking layer which are sequentially stacked in an inward direction from the outer wall of the channel layer 30. The tunnel dielectric layer may include silicon oxide, hafnium oxide, aluminum oxide, zirconium oxide or tantalum oxide. The charge storage layer may include silicon nitride, boron nitride, silicon boron nitride, or polysilicon doped with an impurity. The blocking layer may include a single layer or a stacked layer of silicon oxide, silicon nitride, hafnium oxide, aluminum oxide, zirconium oxide and tantalum oxide. In some embodiments, the gate dielectric layer 32 may have an ONO (oxide-nitride-oxide) stack structure in which an oxide layer, a nitride layer and an oxide layer are sequentially stacked. Accordingly, the disclosed structures may include memory cells, source select transistors, and drain select transistors formed in areas in which the electrode layers 20 surround the vertical channels CH.

The hard mask pattern HM may be disposed on electrode structures ES in the connection area CNR. The opening holes OP and the slit SLT described above with reference to FIGS. 3 and 4 may be defined in the hard mask pattern HM. The contact holes H described above with reference to FIGS. 3 and 4 may be defined in the electrode structure ES.

The contact holes H may extend to different depths in the third direction. For example, distances from the source plate 10 to the bottom surfaces of the contact holes H may be different from one another. Each of the electrode layers 20 of the electrode structures ES may have a pad area LP which is exposed by at least one of the contact holes H.

The logic structure P may include a logic circuit 40, a bottom dielectric layer 50, and bottom wiring lines 60. The logic circuit 40 may include transistors TR on active regions of the substrate 11 defined or bounded by an isolation layer 11A. While not illustrated, the logic circuit 40 may further include capacitors, inductors, and so forth. The logic circuit 40 may constitute the row decoder 121, the page buffer circuit 122 and the peripheral circuit 123 of FIG. 1.

The bottom dielectric layer 50 may be defined or disposed on the substrate 11 to cover the logic circuit 40. The bottom dielectric layer 50 may include, for example, silicon oxide, HDP (high density plasma) oxide or TEOS (tetra-ethyl-ortho-silicate) oxide.

The bottom wiring lines 60 may be disposed in the bottom dielectric layer 50. The bottom wiring lines 60 may be disposed in a plurality of bottom wiring layers which are layered at vertically different positions or locations in the third direction. Contacts 62 may be formed in the bottom dielectric layer 50 to couple the logic circuit 40 and the bottom wiring lines 60; to couple the substrate 11 and the bottom wiring lines 60; and to couple the bottom wiring lines 60 that are disposed at different wiring layers. Although the present embodiment illustrates that the semiconductor memory device includes three bottom wiring layers, it is to be noted that the disclosure is not limited thereto. One or at least two bottom wiring layers may be provided.

A contact plug CNT, which passes through the electrode structure ES and the source plate 10, may be defined or located under the hard mask pattern HM to couple the hard mask pattern HM and the bottom wiring line 60 of the logic structure P. The contact plug CNT may not pass through the hard mask pattern HM, but may be coupled to a bottom surface of the hard mask pattern HM. The contact plug CNT may be coupled to the substrate 11 through the bottom wiring lines 60 and the contacts 62 of the logic structure P. Thus, a discharge path DP may discharge the charges, accumulated during an etching process, charged in the hard mask pattern HM to the substrate 11.

A sidewall dielectric layer SP2 may be formed on the outer wall of the contact plug CNT to electrically isolate the contact plug CNT from the electrode layers 20 of the electrode structure ES and to electrically isolate the contact plug CNT and the source plate 10 from each other. The sidewall dielectric layer SP2 may be formed of silicon oxide.

Referring to FIGS. 5 and 6, contacts 70 may be defined by the opening holes OP and disposed in the contact holes H thereunder. The bottom ends of the contacts 70 may be coupled to the pad areas LP of the electrode layers 20. A sidewall dielectric layer SP3 may be defined on the outer walls of a contact 70 to insulate the contact 70 from the electrode layers 20 of the electrode structure ES. The sidewall dielectric layer SP3 may be formed of silicon oxide.

A top dielectric layer 80 may be disposed to cover the electrode structure ES, the vertical channel CH, the hard mask pattern HM and the contacts 70 and fill the slit SLT. The top dielectric layer 80 may include, for example, silicon oxide, HDP oxide or TEOS oxide.

Top wiring lines 90 and a bit line BL may be disposed on the top dielectric layer 80. Vias 92, which pass through the top dielectric layer 80, may be defined under the top wiring lines 90 to couple the top wiring lines 90 and the contacts 70.

A bit line BL may extend in the second direction SD. While only one bit line BL is illustrated in FIG. 6 for the sake of simplification in illustration, a plurality of bit lines BL may be repeatedly provided in the first direction FD with a predetermined pitch. A bit line contact BLC, which passes through the top dielectric layer 80, may be defined under the bit line BL to couple the bit line BL and the channel layer 30 of the vertical channel CH.

Figure 7:
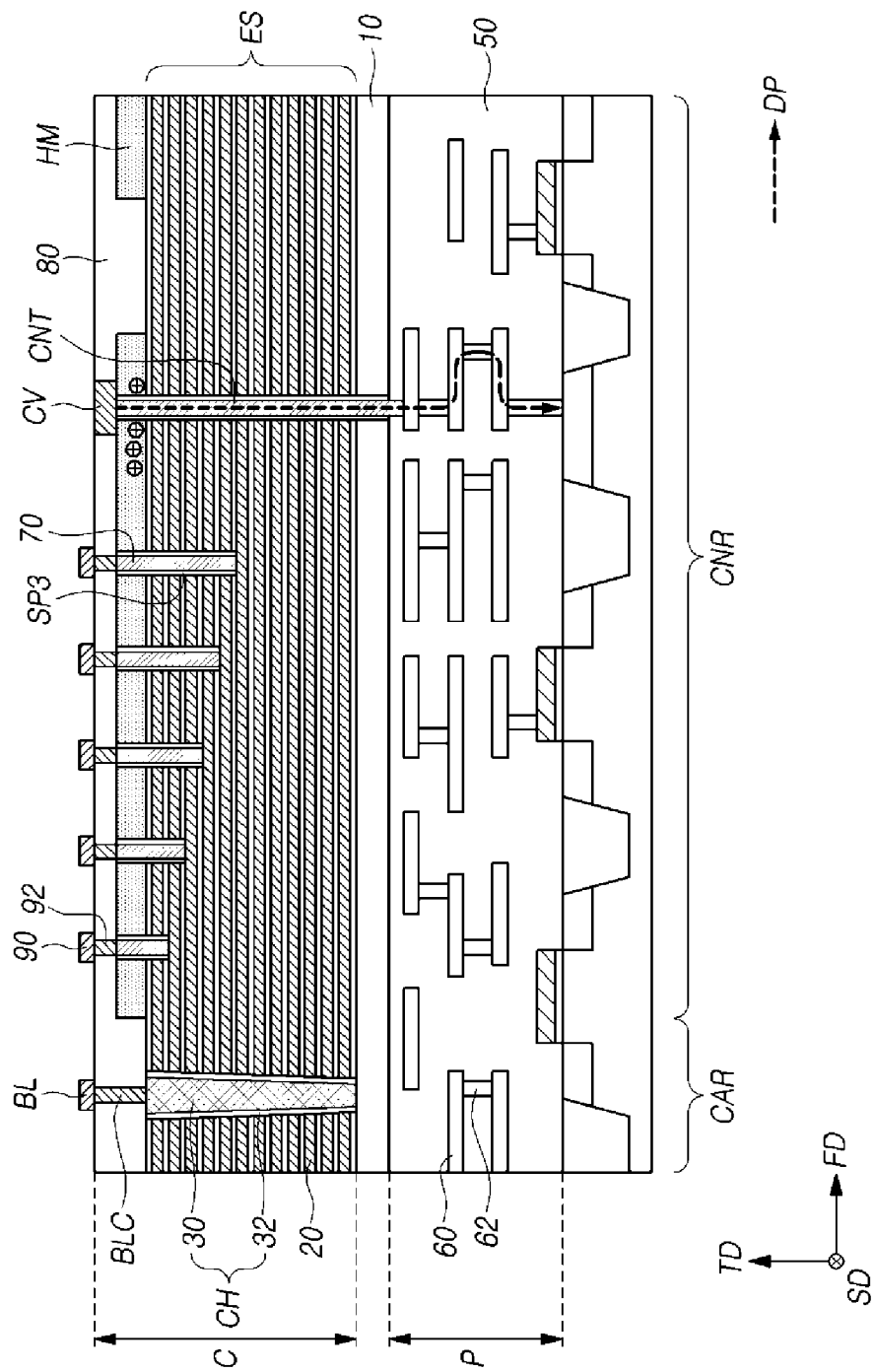
Figure 8:
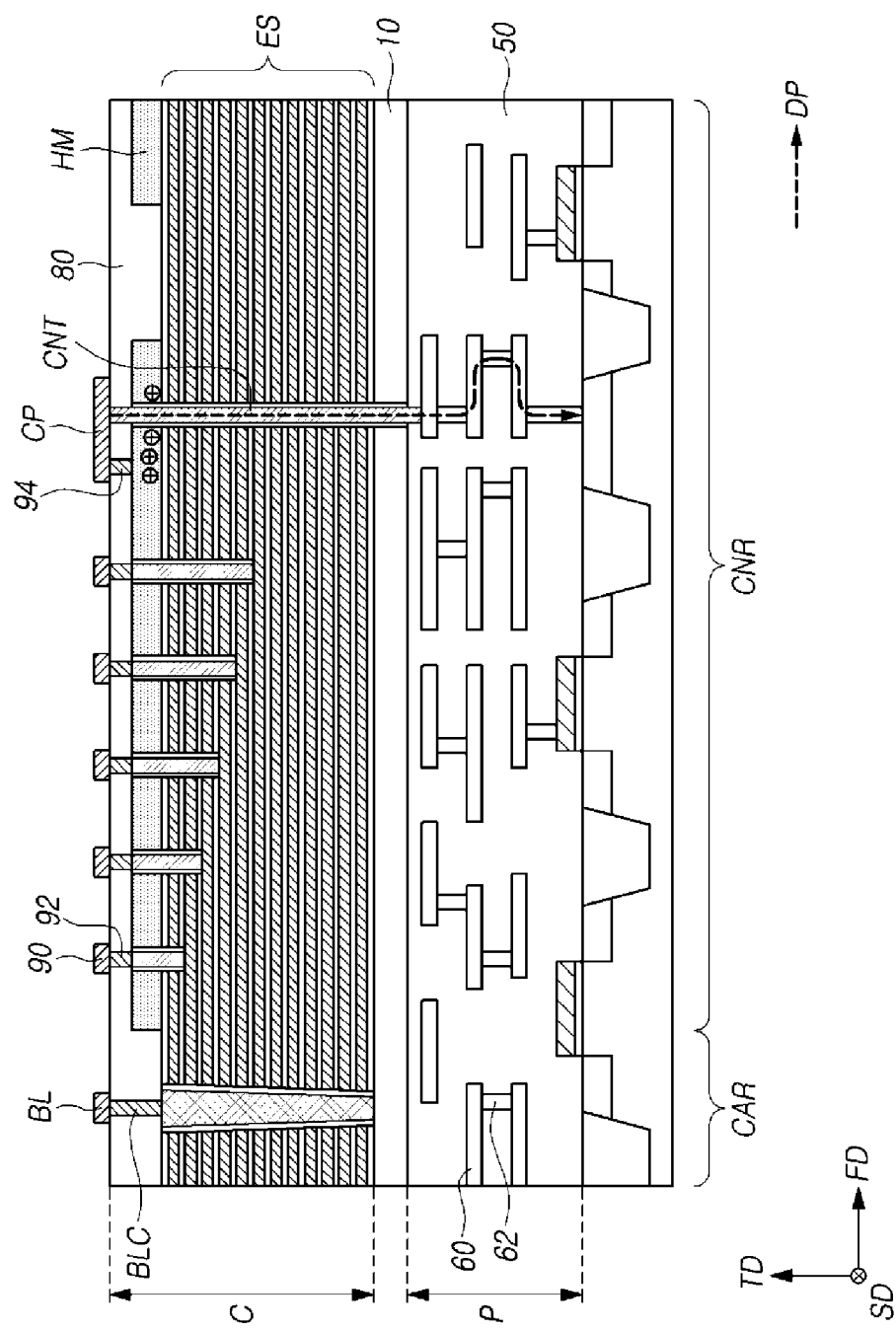

FIGS. 7 and 8 are cross-sectional views illustrating examples of semiconductor memory devices in accordance with embodiments of the disclosure.

Referring to FIG. 7, a contact plug CNT, which facilitates a discharge path DP, may pass through a hard mask pattern HM, an electrode structure ES, a source plate 10 and a portion of a bottom dielectric layer 50. Thus, the contact plug CNT may be coupled to one of bottom wiring lines 60 of a logic structure P. The top surface of the contact plug CNT may be disposed or positioned on substantially the same plane as the top surface of the hard mask pattern HM.

A coupling via CV, which is disposed in a top dielectric layer 80, may be defined to couple the contact plug CNT and the hard mask pattern HM. A bottom surface of the coupling via CV may be brought into contact with a top surface of the contact plug CNT and a top surface of the hard mask pattern HM. The top surface of the coupling via CV may be disposed or located on substantially the same plane as the top surface of the top dielectric layer 80. The coupling via CV may be formed at the same process step as that used to form a bit line contact BLC or/and vias 92.

Referring to FIG. 8, a contact plug CNT, which configures a discharge path DP, may pass through a top dielectric layer 80, a hard mask pattern HM, an electrode structure ES, a source plate 10 and a portion of a bottom dielectric layer 50. Thus, the contact plug CNT may be coupled to one of bottom wiring lines 60. The top surface of the contact plug CNT may be disposed or positioned on substantially the same plane as the top surface of the top dielectric layer 80.

A coupling pad CP, which is coupled to the contact plug CNT, may be defined on the top dielectric layer 80. A via 94, which passes through the top dielectric layer 80, may be defined under the coupling pad CP to couple the coupling pad CP and the hard mask pattern HM. The coupling pad CP may be formed at the same process step as that used to form a bit line BL or/and top wiring lines 90. The coupling pad CP may be disposed at the same level or layer as the bit line BL or/and the top wiring lines 90. The via 94 may be formed at the same process step as that used to form a bit line contact BLC or/and vias 92.

Reducing failures in a manufacturing process is an important factor that determines the yield and the price of a product. According to the embodiments of the disclosure, in a manufacturing process, the charges that are charged in the hard mask pattern HM during a manufacturing process may be reduced or the charges charged in the hard mask pattern HM may be discharged. Therefore, it is possible to suppress a failure that may occur in a subsequent manufacturing step or process due to the presence of the charges charged in the hard mask pattern HM. For example, an etching failure due to the presence of the charges charged in the hard mask pattern HM, in a plasma etching process for forming bit lines or top wiring lines, may be suppressed.

Figure 9:
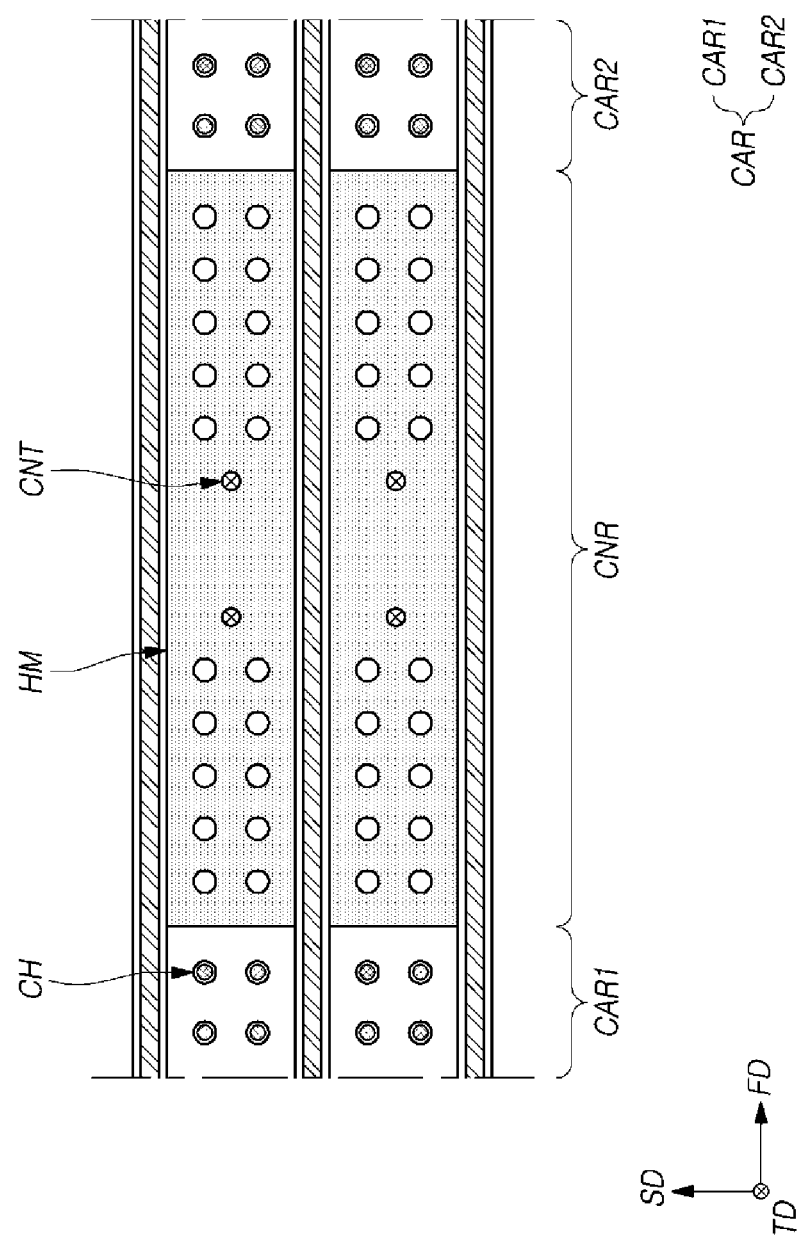
FIG. 9 is a top view illustrating an example of a semiconductor memory device in accordance with an embodiment of the disclosure.

FIG. 9 is a top view illustrating an example of a semiconductor memory device in accordance with an embodiment of the disclosure.

Referring to FIG. 9, a slit (SLT of FIG. 3) may not be defined in a hard mask pattern HM in a connection area CNR. A contact plug CNT may be coupled to the hard mask pattern HM to provide a discharge path. The charges charged in the hard mask pattern HM may be discharged to the outside through the contact plug CNT.

Hereinafter, a manufacturing method in accordance with an embodiment of the disclosure will be described with reference to FIGS. 10A to 14B.

FIGS. 10A to 14A are examples of top views to assist in the explanation of steps of a method for manufacturing a semiconductor memory device in accordance with an embodiment of the disclosure. FIGS. 10B to 14B are cross-sectional views taken along the lines A-A' of FIGS. 10A to 14A.

Figure 10A:
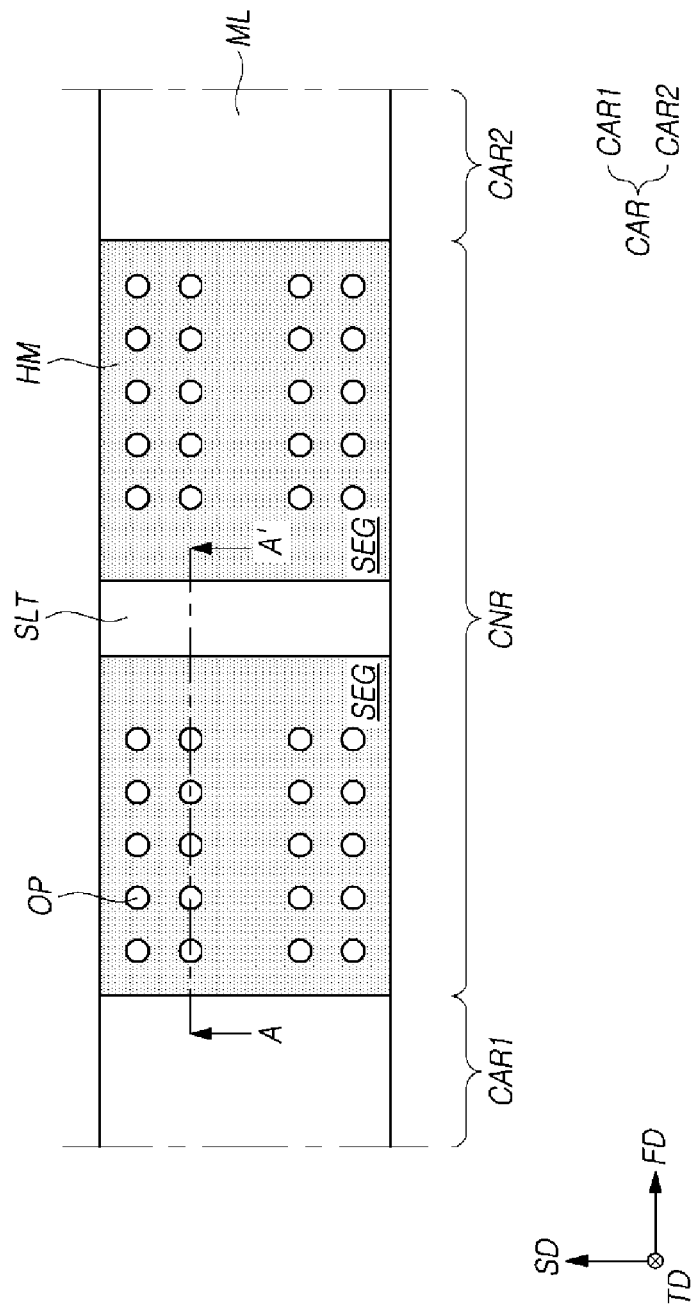

Referring to FIGS. 10A and 10B, first material layers 22 and second material layers 24 may be alternately stacked on a source plate 10 in which cell areas CAR1 and CAR2 and a connection area CNR are defined, and thereby, a stack ML may be formed.

The first material layers 22 and the second material layers 24 may be formed of different materials. For example, the first material layers 22 may be formed of a dielectric material for interlayer dielectric layers, and the second material layers 24, which are used as sacrificial layers, may be formed of a dielectric material that has an etching selectivity with respect to the first material layers 22. For example, the first material layers 22 may be formed of silicon oxide. The second material layers 24 may be formed of silicon nitride.

A hard mask pattern HM may be formed on the stack ML in the connection area CNR. A plurality of opening holes OP and a slit SLT may be defined in the hard mask pattern HM. The hard mask pattern HM may be divided into a plurality of segments SEG by the slit SLT. The slit SLT may have a line shape which extends in the second direction SD. The segments SEG of the hard mask pattern HM which are divided by the slit SLT may be disposed and spaced apart in the first direction FD.

The hard mask pattern HM may be formed of a material which has an etch selectivity with respect to the first and second material layers 22 and 24. For example, the hard mask pattern HM may be formed of a metal.

Figure 11A:
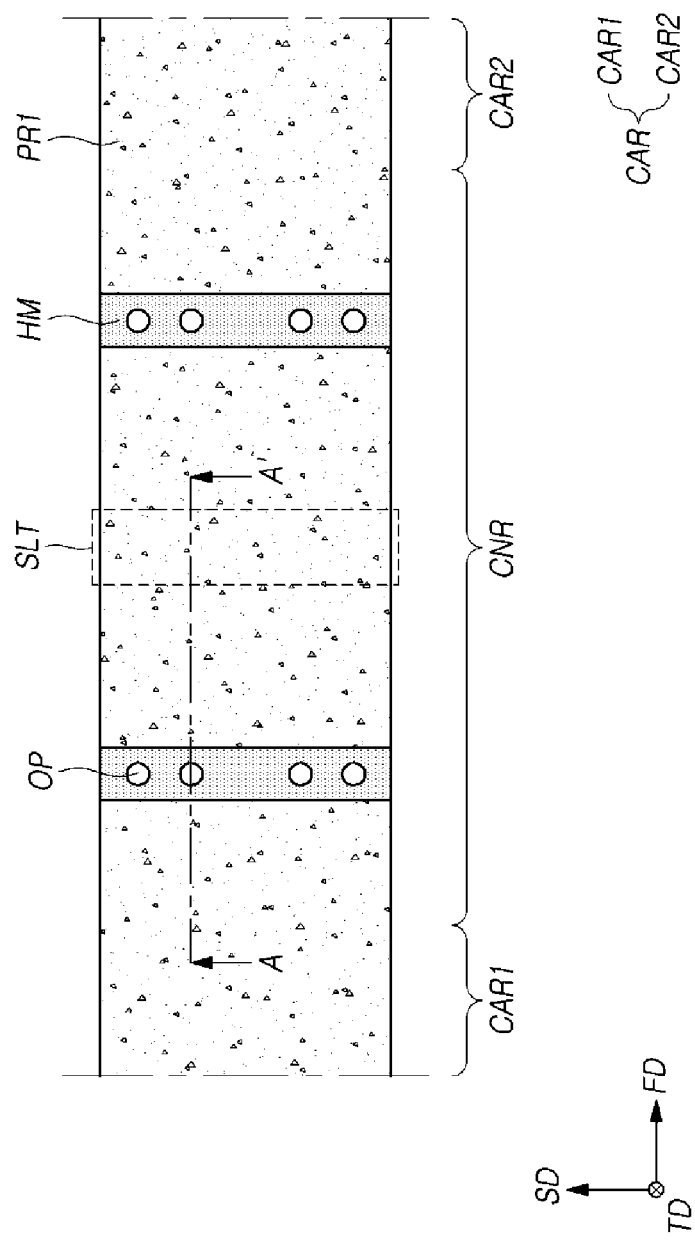

Referring to FIGS. 11A and 11B, a first mask pattern PR1 having openings which expose portions of the respective segments SEG of the hard mask pattern HM may be formed on the hard mask pattern HM. By using first mask pattern PR1, the opening holes OP in each of the segments SEG of the hard mask pattern HM may be exposed, while other opening holes OP and the slit SLT are covered.

A first unit etching process of etching the stack ML using the first mask pattern PR1 and the hard mask pattern HM as an etch mask may be performed. The etch depth of the first unit etching process may be a first depth d1. The first depth d1 may be the same as the vertical pitch of the second material layers 24. The vertical pitch of the second material layers 24 may be defined as the sum of the thickness of one of the second material layers 24 and one of the first material layers 22. The thickness of one of the second material layers 24 is substantially the same as the thickness of one of the electrode layers 20 of FIG. 5.

Figure 12A:
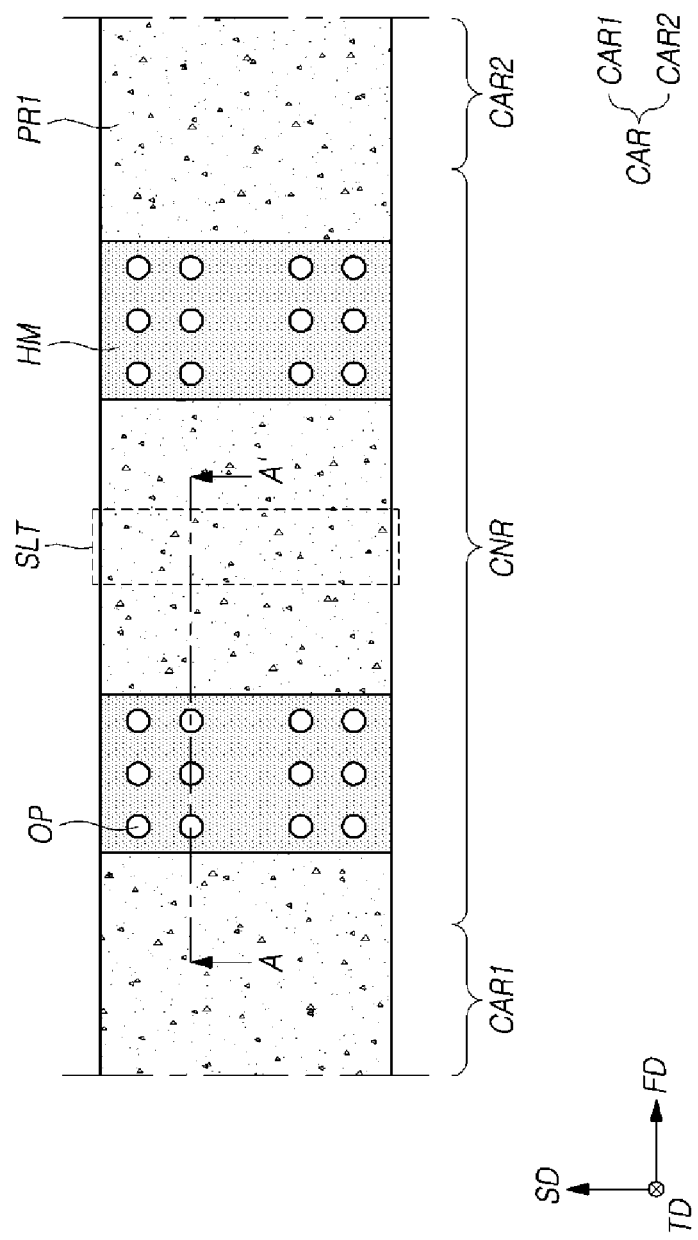

Referring to FIGS. 12A and 12B, a trimming process may be performed for the first mask pattern PR1. Namely, an isotropic etching process may be performed for the first mask pattern PR1. The trimming process may be performed using an etchant capable of removing the first mask pattern PR1. Due to this fact, the height and width of the first mask pattern PR1 may be reduced. By etching down the width of the first mask pattern PR1, additional opening holes OP may be exposed.

The steps described above with reference to FIGS. 11A to 12B may constitute one cycle. The cycle may include the unit etching process of etching, to a first depth d1, the stack ML under the opening holes OP exposed by the first mask pattern PR1 and the hard mask pattern HM. The first mask pattern PR1 and the hard mask pattern HM may be used as an etch mask. The cycle includes the process of reducing or trimming the width of the first mask pattern PR1 to expose additional opening holes OP.

Figure 13A:
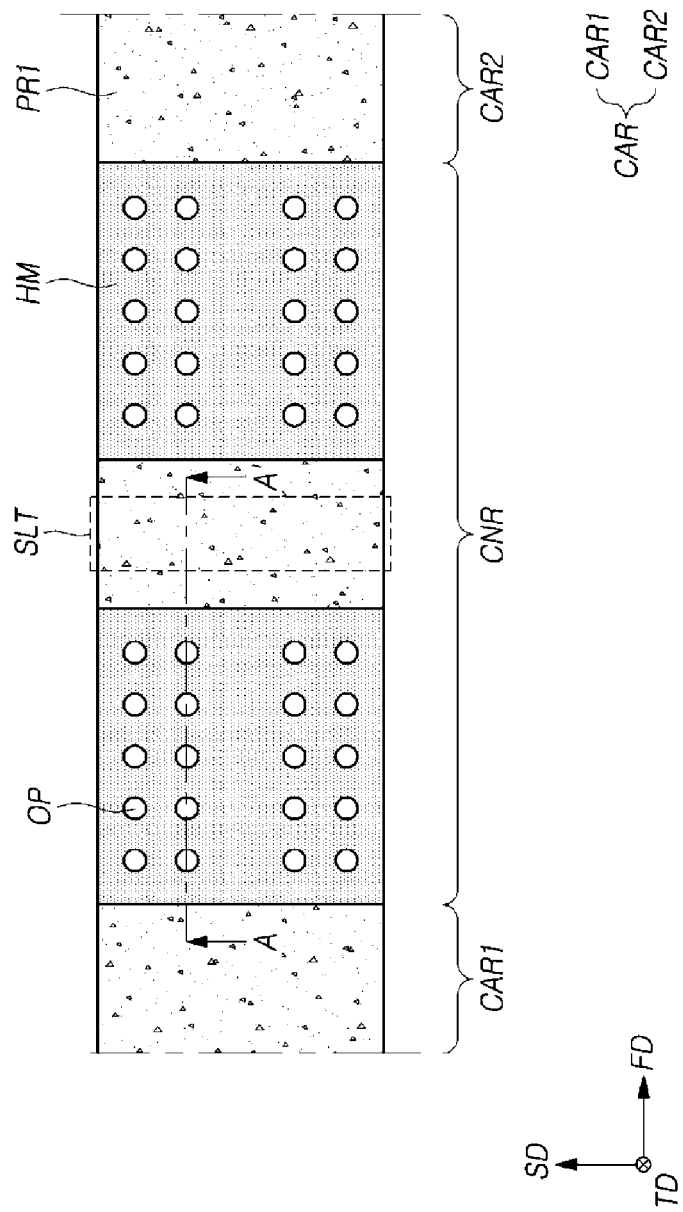
Figure 13B:
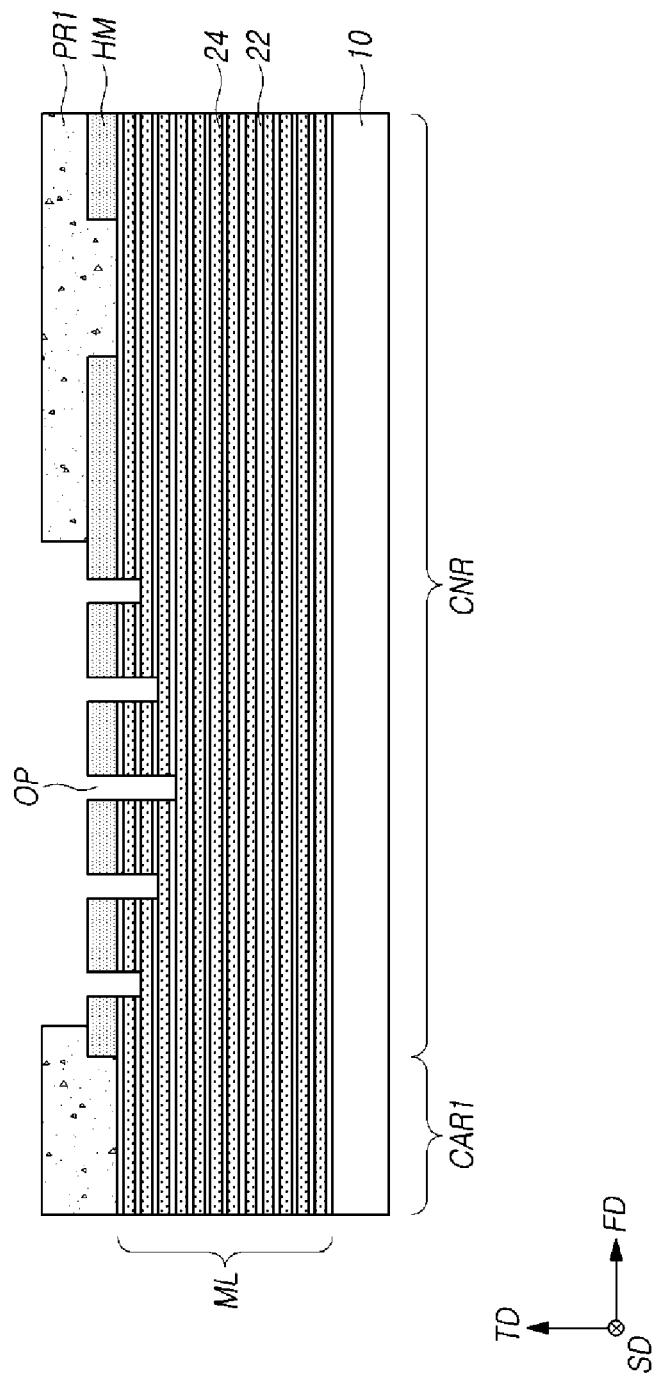

Referring to FIGS. 13A and 13B, the cycle described above may be repeated at least N times (where N is a natural number of 2 or greater). In an embodiment, N is 3, however, N may number 2 or more in other embodiments contemplated by the disclosure. The slit SLT is covered by the first mask pattern PR1 while the cycle is repeated. The first mask pattern PR1 may be formed using a photolithography process, and may be removed after the N cycles.

Figure 14A:
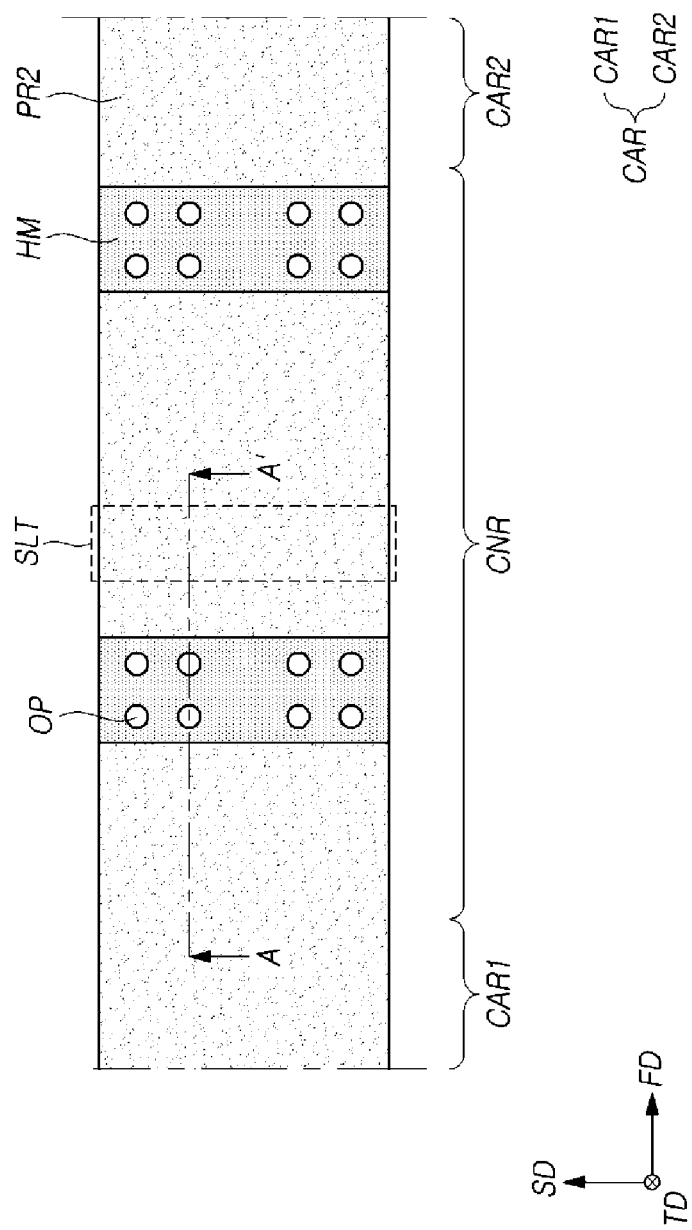
Figure 14B:
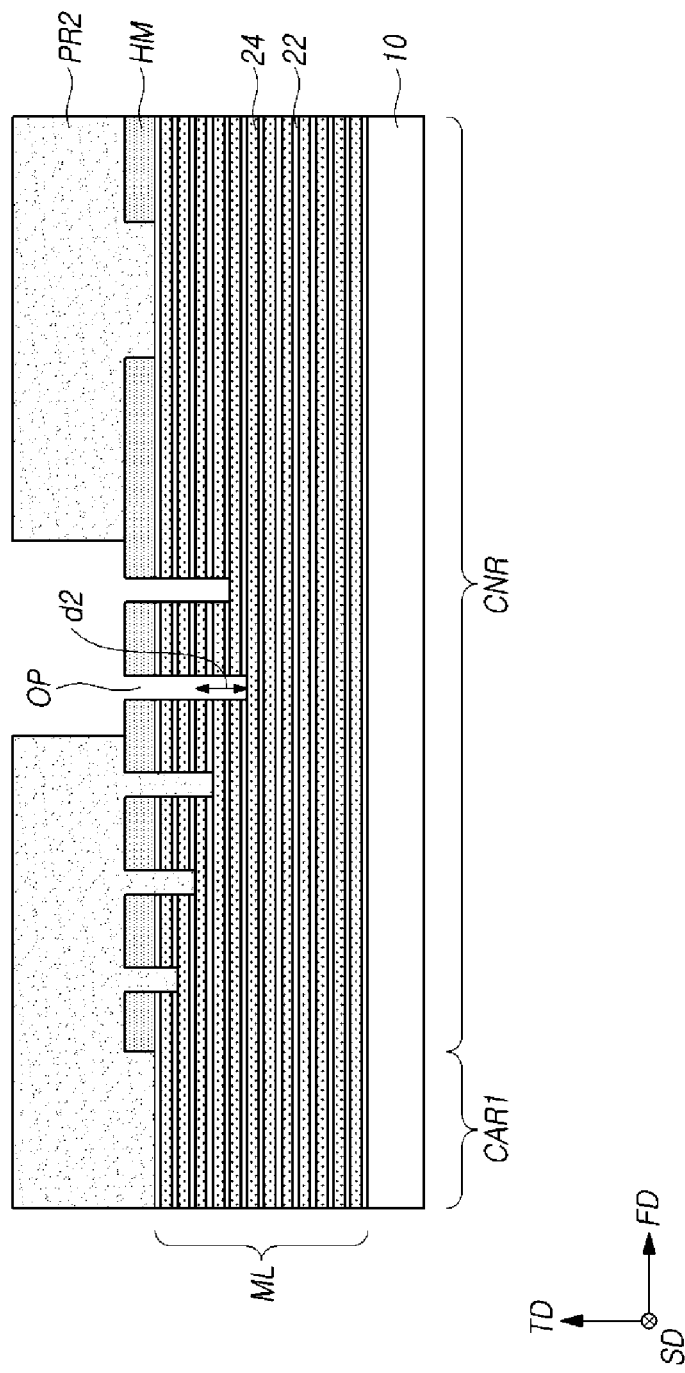

Referring to FIGS. 14A and 14B, a second mask pattern PR2 may be formed on the stack ML and the hard mask pattern HM. The second mask pattern PR2 may expose some of the opening holes OP, while covering other opening holes OP and the slit SLT.

A recess etching process of etching the stack ML using the second mask pattern PR2 and the hard mask pattern HM as an etch mask may be performed. The etching depth of the recess etching process may be a second depth d2. The second depth d2 may be M (where M is a natural number of 2 or greater) times the vertical pitch d1 (see FIG. 11B) of the second material layers 24. The second depth d2 may be larger than the first depth d1. The second mask pattern PR2 may be formed using a photolithography process, and may be removed after the recess etching process.

Thereafter, although not illustrated, a slit which divides the stack ML may be formed, the second material layers 24 may be removed by injecting an etchant through the slit, and then, an electrode material may be filled in spaces from which the second material layers 24 are removed. Thus, the second material layers 24 may be replaced with electrode layers 20 illustrated in FIG. 5.

Figure 15:
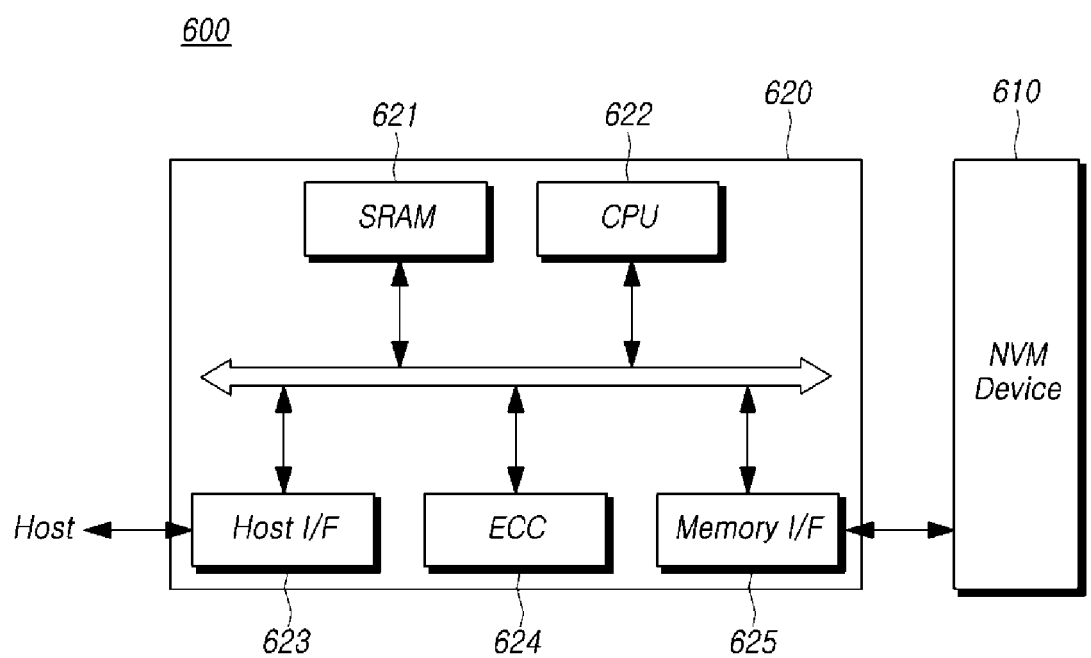
FIG. 15 is a diagram schematically illustrating a representation of an example of a memory system including a semiconductor memory device in accordance with an embodiment of the disclosure.

FIG. 15 is a block diagram schematically illustrating an example of a memory system including a semiconductor memory device in accordance with an embodiment of the disclosure.

Referring to FIG. 15, a memory system 600 in accordance with an embodiment may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit 622. A host interface 623 includes a data exchange protocol of a host which is coupled with the memory system 600.

An error correction code block 624 detects and corrects an error included in data read from the nonvolatile memory device 610.

A memory interface 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 16:
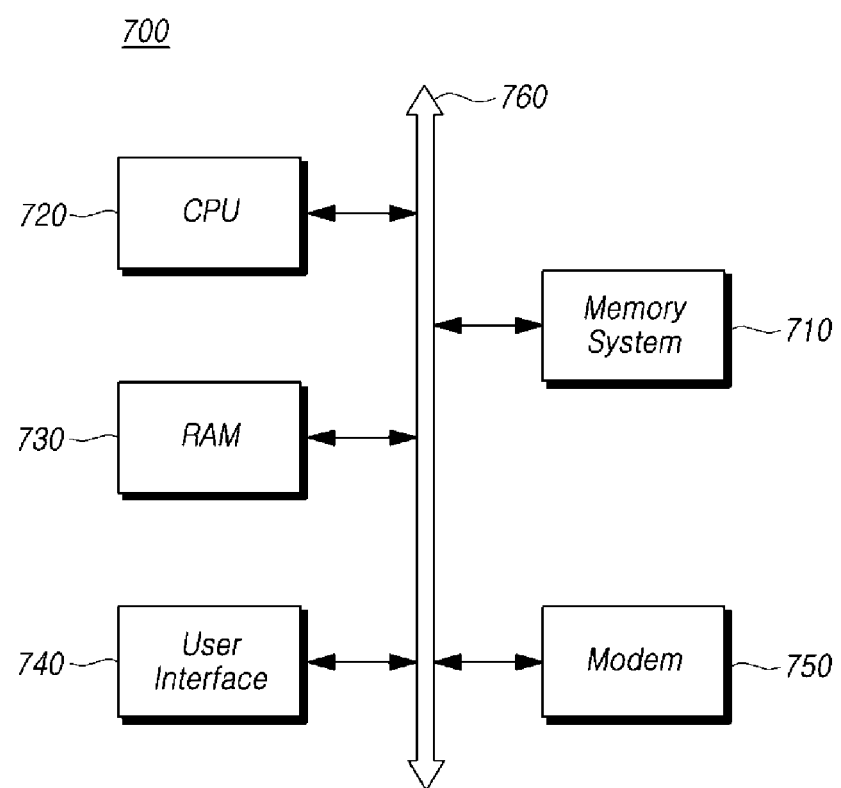
FIG. 16 is a block diagram schematically illustrating a representation of an example of a computing system including a semiconductor memory device in accordance with an embodiment of the disclosure.

FIG. 16 is a block diagram schematically illustrating an example of a computing system including a semiconductor memory device in accordance with an embodiment of the disclosure.

Referring to FIG. 16, a computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
    an electrode structure including a plurality of electrode layers and a plurality of interlayer dielectric layers which are alternately stacked on a source plate defined with a cell area and a connection area in a first direction;
    a vertical channel passing through the electrode structure in the cell area;
    a hard mask pattern disposed on the electrode structure in the connection area, and having a plurality of opening holes;
    a plurality of contact holes defined in the electrode structure under the opening holes, and exposing pad areas of the electrode layers; and
    a slit dividing the hard mask pattern into units smaller than the electrode structure in the connection area.

2. The semiconductor memory device according to claim 1, wherein the electrode structure has a line shape extending in a first direction, and one or more units of the hard mask pattern are arranged in the first direction.

3. The semiconductor memory device according to claim 2, further comprising:
    a bit line coupled to the vertical channel and disposed on the hard mask pattern,
    wherein the bit line extends in a second direction, which intersects with the first direction to form a plane substantially parallel to a surface of the electrode structure or of the source plate.

4. The semiconductor memory device according to claim 3, wherein one or more units of the hard mask pattern are formed by a slit with a line shape that extends in the second direction.

5. The semiconductor memory device according to claim 3, wherein a width of the one or more units of the hard mask pattern, in the second direction, is the same as a width of the electrode structure in the second direction.

6. The semiconductor memory device according to claim 3, further comprising:
    separation patterns disposed on both sides of the electrode structure and the hard mask pattern in the second direction,
    wherein the slit extends in the second direction between a pair of adjacent separation patterns.

7. The semiconductor memory device according to claim 1, further comprising:
    a discharge path coupled to the hard mask pattern.

* * * * *